(12) United States Patent
Völkening et al.

(10) Patent No.: US 8,534,557 B2
(45) Date of Patent: Sep. 17, 2013

(54) METHOD AND DEVICE FOR READING INFORMATION OPTICALLY

(75) Inventors: Stephan Völkening, Köln (DE); Torsten Hupe, Oberhaching (DE)

(73) Assignee: Bayer Innovation GmbH, Dusseldorf (DE)

( * ) Notice: Subject to any disclaimer, the term of this patent is extended or adjusted under 35 U.S.C. 154(b) by 1288 days.

(21) Appl. No.: 11/689,897

(22) Filed: Mar. 22, 2007

(65) Prior Publication Data

US 2008/0041955 A1 Feb. 21, 2008

(30) Foreign Application Priority Data

Mar. 22, 2006 (DE) .......................... 10 2006 012 991

(51) Int. Cl.
*G06K 5/00* (2006.01)
*G06K 7/10* (2006.01)

(52) U.S. Cl.
USPC .......................................... 235/457; 235/380

(58) Field of Classification Search
USPC ................... 235/454, 462.34, 457, 380, 487;
359/2, 3, 399, 30, 619, 13, 15; 382/210,
382/115, 100
See application file for complete search history.

(56) References Cited

U.S. PATENT DOCUMENTS

| | | | |
|---|---|---|---|
| 3,328,209 A | 6/1967 | Schneider | |
| 3,483,513 A * | 12/1969 | Burckhardt et al. | 382/210 |
| 3,643,216 A * | 2/1972 | Greenaway et al. | 382/115 |
| 4,304,992 A | 12/1981 | Kobayashi et al. | |
| 4,683,371 A | 7/1987 | Drexler | |
| 4,837,134 A | 6/1989 | Bouldin et al. | |
| 5,128,524 A | 7/1992 | Anglin et al. | |
| 5,336,871 A | 8/1994 | Colgate, Jr. | |
| 5,344,808 A * | 9/1994 | Watanabe et al. | 359/3 |
| 5,412,195 A * | 5/1995 | Babbitt | 235/457 |
| 5,432,329 A * | 7/1995 | Colgate et al. | 235/487 |
| 5,623,347 A * | 4/1997 | Pizzanelli | 359/2 |
| 5,644,412 A | 7/1997 | Yamazaki et al. | |
| 5,712,731 A * | 1/1998 | Drinkwater et al. | 359/619 |
| 5,986,781 A * | 11/1999 | Long | 359/30 |
| 6,005,691 A * | 12/1999 | Grot et al. | 235/487 |
| 6,068,301 A * | 5/2000 | Han et al. | 283/82 |
| 6,452,699 B1 * | 9/2002 | Athale et al. | 359/13 |

(Continued)

FOREIGN PATENT DOCUMENTS

| | | |
|---|---|---|
| CA | 1298913 C | 4/1992 |
| DE | 2708331 A1 | 9/1977 |

(Continued)

OTHER PUBLICATIONS http://www.ipdl.inpit.go.jp/homepg_e.ipdl, JP 2001118123 A [Detail Description], retrieved Apr. 17, 2013.*

(Continued)

*Primary Examiner* — Thien T Mai
(74) *Attorney, Agent, or Firm* — Baker Donelson Bearman Caldwell & Berkowitz, PC

(57) ABSTRACT

The present invention relates to a novel type of information carrier, onto which information is stored in the form of diffraction structures. An information carrier according to the present invention can be read by being drawn manually through a reading device. The present invention also relates to a device with which an information carrier according to the invention can be read.

6 Claims, 4 Drawing Sheets

(56) References Cited

U.S. PATENT DOCUMENTS

| | | |
|---|---|---|
| 6,641,831 B1 | 11/2003 | Schierholz .................... 424/422 |
| 2002/0043562 A1 | 4/2002 | Zazzu et al. |
| 2002/0080994 A1* | 6/2002 | Lofgren et al. ............... 382/100 |
| 2002/0148900 A1* | 10/2002 | Gurevich et al. ........ 235/462.34 |
| 2003/0223102 A1* | 12/2003 | Thor et al. ...................... 359/15 |
| 2004/0027626 A1* | 2/2004 | Yamauchi et al. ................ 359/3 |
| 2004/0031849 A1* | 2/2004 | Hori et al. ...................... 235/454 |
| 2004/0240006 A1* | 12/2004 | Staub et al. ........................ 359/2 |
| 2004/0247874 A1* | 12/2004 | Ryzi et al. .................... 428/410 |
| 2005/0093856 A1* | 5/2005 | Borgsmuller et al. ........ 345/418 |
| 2005/0100222 A1 | 5/2005 | McGrew |
| 2006/0055993 A1* | 3/2006 | Kobayashi et al. ................ 359/3 |
| 2006/0077542 A1* | 4/2006 | Tanaka .......................... 359/399 |
| 2006/0215243 A1* | 9/2006 | Haga et al. ........................ 359/3 |

FOREIGN PATENT DOCUMENTS

| | | |
|---|---|---|
| DE | 19812160 C1 | 7/1999 |
| DE | 19852192 A1 | 5/2000 |
| EP | 0231351 A1 | 8/1987 |
| EP | 0 470 433 A1 | 2/1992 |
| EP | 1 080 466 A1 | 3/2001 |
| EP | 1 252 623 A2 | 10/2002 |
| JP | 07304286 A * | 11/1995 |
| JP | 2000268147 A * | 9/2000 |
| JP | 2001118123 A * | 4/2001 |
| JP | 22217 | 1/2006 |
| WO | WO 87/00947 | 2/1987 |
| WO | WO 88/08120 | 10/1988 |
| WO | 01/57859 A2 | 8/2001 |

OTHER PUBLICATIONS

PCT International Search Report.

J.C. Santamarina, K.A. Klein, Yh Wang, E. Prencke: Specific Surface: Determination and Relevance, Can. Geotech J. vol. 39, (2002). pp. 233-241.

Office Action issued in Israeli Patent Application No. 194084 dated Oct. 10, 2011.

P. Hariharan, "Basics of Holography", Cambridge University Press, 2002, p. 8-10.

"International Standard, Information Technology—Automatic Identification and Data Capture Techniques—Data Matrix Bar Code Symbology Specification", Second Edition, Sep. 16, 2006, Reference No. ISO/IEC 16022:2006.

L.P. Yaroslavskii, "Advances in Electronics and Electron Physics", vol. 66, Editor Peter W. Hawks, Academic Press, Inc. 1986, pp. 92-140.

L.H. Lin, "A Method of Hologram Information Reduction by Spatial Frequency Sampling", XP008036206, Applied Optics, Mar. 1968, vol. 7, No. 3, pp. 545-548.

* cited by examiner

Fig. 2
a)
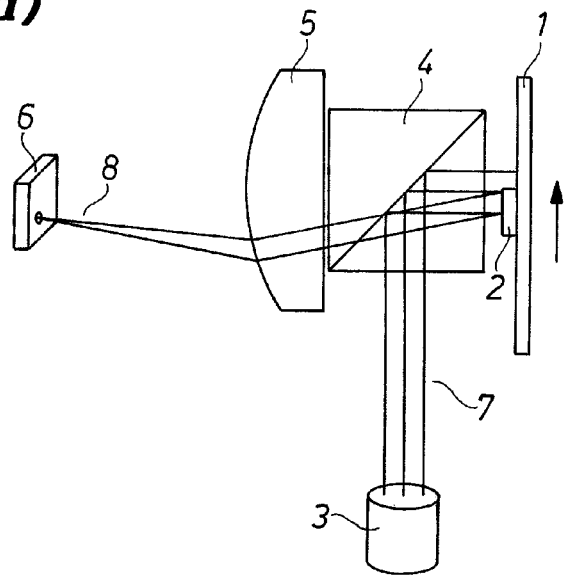
b)
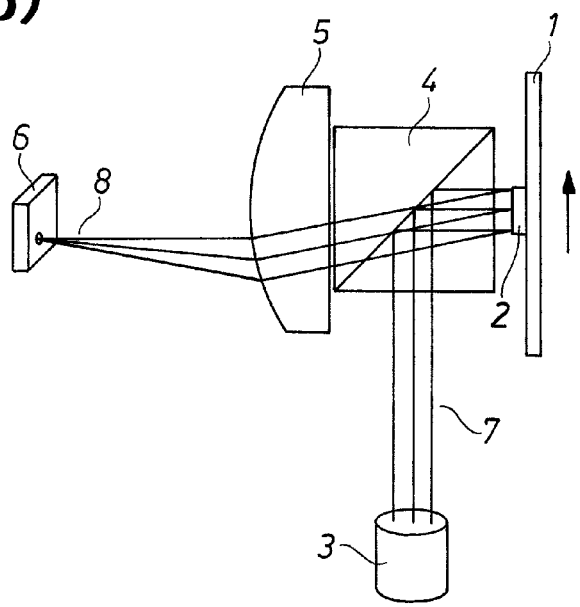

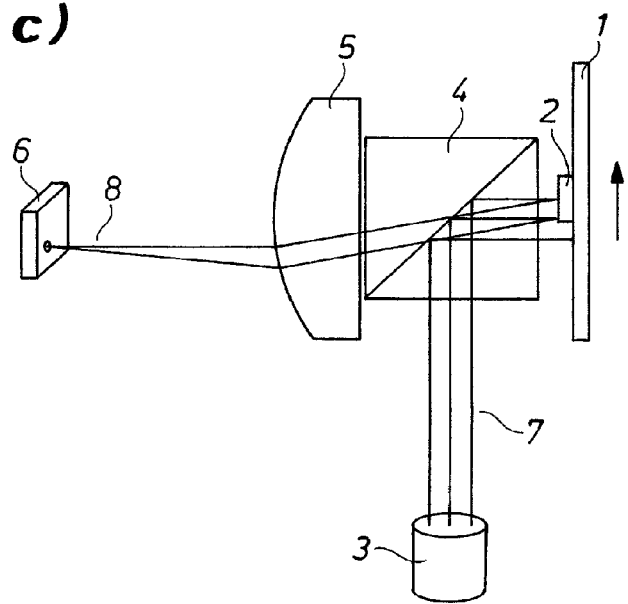
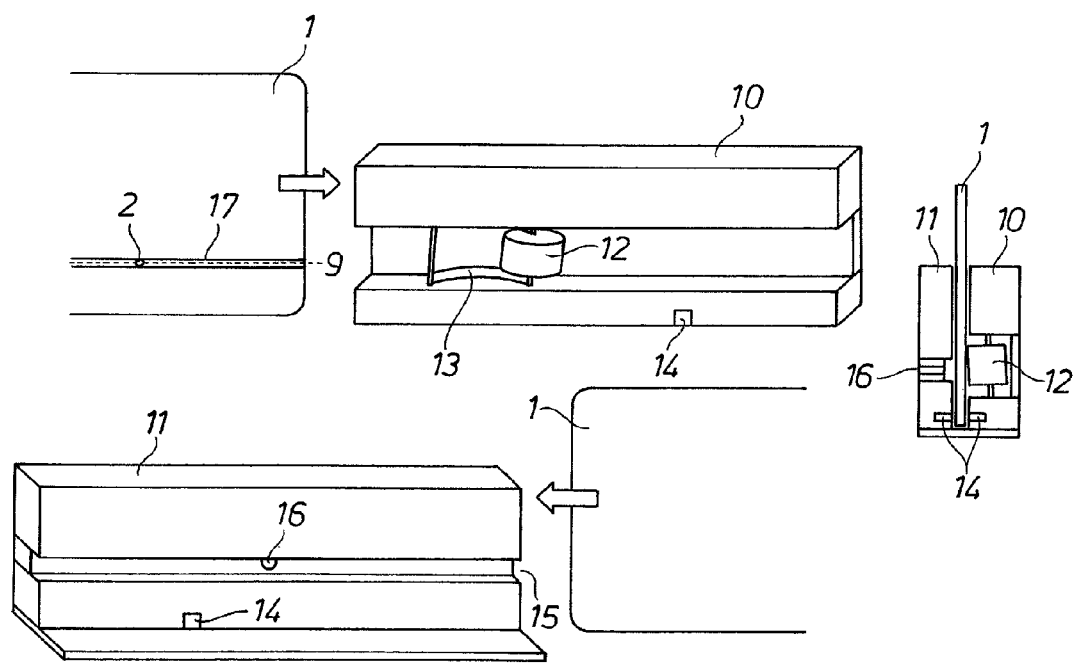

Fig. 4
a) 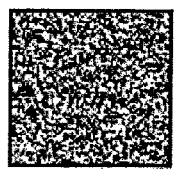
b) 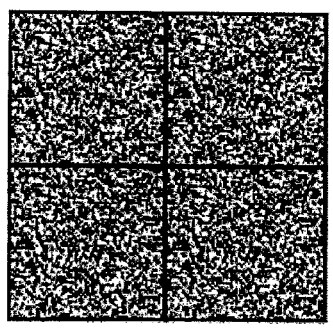
c) 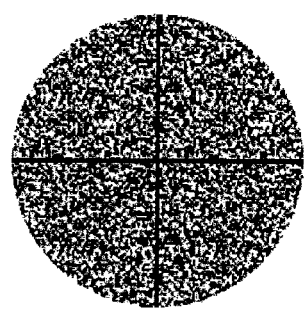

METHOD AND DEVICE FOR READING INFORMATION OPTICALLY

CROSS REFERENCE TO RELATED APPLICATION

This application claims priority from German Patent Application 1020060129911 filed Mar. 22, 2006, the content of which is incorporated herein by reference in its entirety.

BACKGROUND OF THE INVENTION

1. Field of the Invention

The present invention relates generally to a novel type of information carrier, on which information can be stored in the form of diffraction structures. The information carrier according to the present invention can be read, for example, by being drawn manually through a reading device.

2. Description of Related Art

Plastic cards as information carriers are ubiquitous nowadays. As a consequence of increasing data processing by machine, a person typically has a series of plastic cards with which he can authenticate himself. Examples which may be mentioned include company identity cards, medical insurance cards, credit, Eurocheque and debit cards.

Particularly widespread is the ID-1 format, which is characterized in the ISO/IEC 7810 Standard ("credit card format"). It has a convenient size and can be accommodated in purses. There are many card readers which are based on this format.

Machine-readable information can be stored on plastic cards in various ways. For instance, optically in the form of optically readable letters (OCR=Optical Character Recognition), bar or matrix codes, magnetically in a magnetic strip or electronically in a chip. However, the aforementioned storage methods only permit the storage of a few bytes (OCR) to kilobytes (chip). The greatest storage capacity in plastic cards is achieved nowadays by optical memory cards.

In WO8808120 (A1) and EP0231351 (A1), optical memory cards are described in which data is exposed photographically into a silver halide film which is applied to the plastic cards. The data can be written and read with a laser. In WO 8808120 (A1), a device is described with which the film can be written and read. The data is present digitally in the form of data points. The data points exhibit a different reflectance as compared with the surroundings and in this way can be read with the aid of a laser beam and a photodetector.

A disadvantage with this type of card and card reader is that the card must be positioned exactly with respect to read beam and detector in order to read the data. In order to read out the individual data points one after another, the card must also be moved relative to a read beam and a detector in such a way that the read beam strikes the data points accurately. This requires a complex card reader having a high positioning accuracy. Moreover, the data density on the card is restricted to the dimension of the positioning accuracy during reading. If the data points are present more densely than the positioning accuracy of the read beam, the individual data points are difficult or even impossible to detect.

When bar code or magnetic strip cards are used, it is possible to draw the card through a card guide in order to read it. Data is read as the card is drawn through manually. In such cards, mechanical positioning of the read head relative to the card is not necessary.

Such a draw-through system for magnetic strip cards is described, for example, in U.S. Pat. No. 5,128,524 (A1).

The implementation of a manual card draw-through system for reading data which is stored on a plastic card is possible in the case of magnetic strips and bar codes, since the data density (quantity of bytes per unit area) is so low that the positioning of the storage medium in relation to the read head is tolerant with respect to the changes which occur during the manual card guidance.

In the optical memory cards described above, the data structures are smaller. Manual positioning of the card in relation to the read head is therefore generally no longer possible.

However, it would be desirable to be able to read optical memory cards having a higher storage capacity than is usual in the case of magnetic strip or bar code cards with the aid of a card draw-through system that can be operated manually.

Advantages of manual card guidance include: 1) greater convenience for the user, since the user does not have to let go of the card, and increased speed of the entire reading process and, 2) reduced production costs of the device, since it is possible to eliminate expensive mechanical positioning, and 3) greater ruggedness of the device.

SUMMARY OF THE INVENTION

There was therefore an object of the present invention to provide an optical memory card which can be read with the aid of a manual card draw-through system.

Surprisingly, it has been found that this and other objects can be achieved by employing an optical memory card according to the present invention. An information carrier and/or card of the present invention is capable of storing data in the form of at least one Fourier hologram.

Additional objects, features and advantages of the invention will be set forth in the description which follows, and in part, will be obvious from the description, or may be learned by practice of the invention. The objects, features and advantages of the invention may be realized and obtained by means of the instrumentalities and combination particularly pointed out in the appended claims.

BRIEF DESCRIPTION OF THE DRAWINGS

FIGS. 1, 2a, 2b, and 2c depict data storage according to one embodiment of the present invention.

FIG. 3 shows one embodiment of a device of the present invention.

FIGS. 4a, 4b, and 4c show Fourier holograms according to the present invention.

DETAILED DESCRIPTION OF A PREFERRED EMBODIMENT

Figure 1:
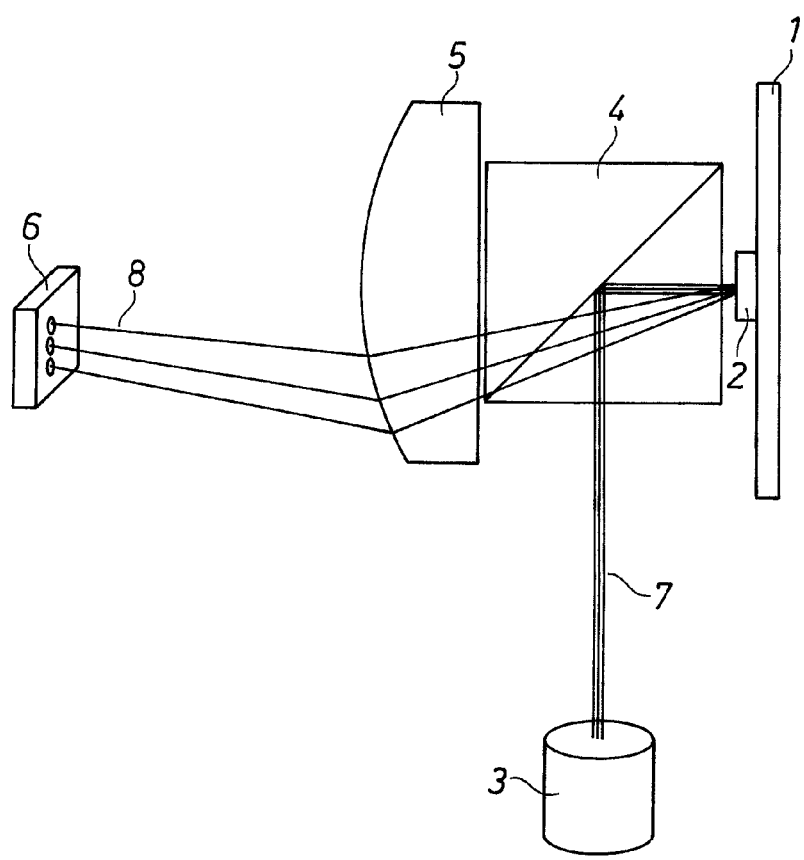

In particular, optical memory cards according to the present invention can generally be read as they are drawn manually through a card guide through a data reading device. In some cases, the structures which represent the data in the storage medium can be smaller than the positioning accuracy of the device reading the data, as the card is being manually drawn therethrough.

Furthermore, an optical memory card according to the present invention typically possesses a higher storage capacity than memory cards of the prior art.

Objects of the present invention can be achieved by means of information carriers, in particular optical memory cards, on which data is stored in the form of Fourier holograms. Such information carriers form a first subject of the present invention.

In one embodiment, the information (data) to be read is present in the form of at least one Fourier hologram on a flat information carrier, for example a plastic card.

Suitable storage media for the hologram include all materials which are conventional and known to those skilled in the art onto which a flat surface can be produced. Examples include polymers, metals, papers, textiles, coatings, stoneware and so on, into which the holographic structures are introduced by means of embossing, etching, photolithography, granolithography, abrasion or cutting. Composite materials, which are formed by combination of the above-mentioned materials, are also conceivable, and can be used if desired for any reason. In addition, it is possible to employ a polymer film to which a metal film is applied. In the case of photosensitive materials or composite materials with photosensitive components, the holographic structures can also be introduced, for example, by using light (silver halide film, film made of photo-addressable polymer and so on).

A flat information carrier is understood to be an information carrier which generally has a radius of curvature which is substantially larger than the information carrier itself. Such a flat information carrier can comprise, for example, a credit card which has been bent such that it has a radius of curvature of about 3 m, while the card itself is only about 8 cm long and about 5 cm wide.

If desired, the storage medium for the hologram can both be part of the information carrier itself and/or be firmly connected to the information carrier.

A hologram of the present invention can be read in reflection or transmission. They are preferably read in reflection. To this end, a light-reflecting surface is typically required, to which the hologram is applied, or into which the hologram is introduced.

The information carrier should preferably be smooth; that is to say the roughness thereof should preferably be less than the roughness of the holographic structures. The roughness can be determined, for example, by feeler methods (measuring instrument: KLA Tencor Alpha Step 500; measuring method: MM-40001). The surface roughness is preferably less than about $R_a=10$ micrometers.

The data to be stored holographically is preferably present as a two-dimensional distribution of lightness values. One example which may be mentioned is the data matrix code which is specified in ISO/IEC 16022.

In the case of storing such data as a Fourier hologram, the physical lightness distribution of the object is advantageously encoded in the Fourier hologram in the form of angles. This is illustrated schematically in FIG. 1: During the irradiation of the Fourier hologram (2) with a collimated laser beam (7), the light beams are diffracted at different angles at the hologram.

Fourier holograms are known and their properties are described, for example, in P. Hariharan, Basics of Holography, Cambridge University Press, 2002, pages 8 to 10, the content of which is incorporated by reference in its entirety.

With the aid of Fourier optics, the angles can be led back into location information again (FIG. 1 and FIG. 2): The beams diffracted at the same angle are focused at a point by the Fourier lens (5). The beams diffracted at different angles are focused at different points by the Fourier lens.

The points can be imaged on a detector, for example a camera, and can thus be processed further electronically.

One important beneficial aspect of using a Fourier hologram in combination with Fourier optics is that the points imaged on the detector are not displaced if the hologram is displaced at right angles to the incident laser beam; only the intensity of the image on the detector changes. This is illustrated in FIG. 2: If the Fourier hologram (2) is moved through the reader (7), an image appears on the detector as soon as the read beam strikes the hologram partly. The intensity (brightness) of the image rises until the read beam is irradiating the entire hologram and then decreases to zero again until the read beam is no longer illuminating the hologram.

Surprisingly, it has been established that this effect can be used to read information which is stored on a flat information carrier in the form of a Fourier hologram while the information carrier is being displaced in relation to an incident laser beam, that is to say, for example, while the information carrier is being moved manually through a guide.

If the hologram is registered only partially by the read spot, then the image is less bright and less sharp than if the entire hologram is registered by the read spot. From this fact, it could easily be concluded that it is particularly beneficial to configure the read spot to be larger than the hologram so that as many regions of the hologram as possible are always registered by the read spot during the reading process. However, this is typically not the case in connection with the present invention. If the read spot is larger than the hologram, then parts of the information carrier which do not have a hologram are also always illuminated. As a result, in general, fewer light beams are deflected at the hologram, so that the brightness decreases. In addition, scattering effects as a result of irradiating the information carrier outside the hologram can lead to increased background noise on the detector.

Surprisingly, it has been found that the imaging properties during irradiation of the hologram are particularly good if the read spot is smaller than the hologram. The read spot is particularly preferably 0.9 to 0.1 times as large as the hologram.

Particularly good imaging properties can be achieved if a plurality of holograms having the same content, for example in terms of data storage, are placed directly on one another to form a larger hologram. Particularly preferably in one embodiment, 2 to 9 holograms with the same content can be placed directly on one another and therefore form an enlarged hologram.

The geometry of the Fourier holograms is preferably matched to the profile of the read spot. Conventional lasers as a source of the read beam produce a circular or elliptical read spot, in which the intensity decreases from the inside towards the outside.

Particularly good or desirable images can be obtained if four holograms with the same data storage content are assembled to form a larger hologram, of which only a central circular or elliptical region which is somewhat larger than the read spot is applied to the information carrier, as illustrated in FIG. 4: FIG. 4(a) shows a Fourier hologram. This is quadrupled in FIG. 4(b), the four identical holograms being arranged in the form of a rectangle. In FIG. 4(c) the enlarged hologram is cut in such a way that the hologram has the shape of the read spot. For the purpose of better illustration, in FIG. 4 the individual holograms are provided with a black frame, which, however, does not actually occur.

In one advantageous embodiment, the size of the holograms can preferably be from about 0.1 to about 5 mm in diameter.

A further subject of the present invention is a device for reading the optical memory cards according to the invention.

Such a device preferably comprises a light source for a read beam, Fourier optics, a photodetector and a guide device which aligns the information carrier relative to the read beam and to the photodetector during the movement during the reading operation, in particular when being drawn manually through the device. The guide restricts the movement of the information carrier in two spatial dimensions, while the information carrier is moved in the third spatial direction. The information carrier can be, for example, moved manually through the guide and in the process is illuminated with a light beam. The light beam is diffracted at the Fourier hologram of the information carrier, and the diffracted beams are imaged with the aid of Fourier optics onto a detector, where the optical signal is transformed into an electronic signal.

By using a device according to the invention, the optical memory cards according to the present invention can be read in transmission and/or reflection.

One example of an embodiment of such a device, with which memory cards can be read in reflection, is illustrated in FIG. 3. It comprises two guide rails (10 and 11), between which the information carrier (1) can be moved manually. One of the guide rails (10) has a roller (12), which is mounted with a pressure spring (13) and presses the information carrier (1) against the other rail (11) as it is drawn through manually. The roller is tilted slightly, so that an information carrier can be pressed downwards automatically as it is drawn through. Therefore, as it is drawn through manually, the information carrier is pressed both against a rail (11 here) and also against the base of the guide. Therefore, two of three possible spatial directions are restricted. The information carrier can accordingly be moved in the third spatial direction, parallel to the guide rails 10 and 11.

In the process, the carrier sweeps over the read beam (7), which is incident through a hole (16) in one of the guide rails (11 here). The hole (16) is arranged at the level of the hologram (2) on the information carrier (1). At the same height, a groove (15) is preferably milled in the rail which faces the hologram and in which the hole is located. The groove serves to prevent a hologram located on the information carrier from becoming scratched as it is drawn repeatedly through the guide.

A detector (14) is preferably inserted into the guide and detects whether an information carrier is being moved through the guide. For instance, use can be made of a forked light barrier, whose light beam is interrupted by the information carrier. The interruption of the light beam from the light barrier can be used as a trigger for the read beam (3) and the detector (camera) (6). As soon as the light barrier is interrupted, the read beam is switched on and the image on the camera is evaluated.

It is also possible to switch the camera on with a defined time delay relative to the read beam.

It is likewise possible to use a plurality of light barriers if desired for any reason.

It is also possible for a plurality of holograms to be read one after another. The holograms can then preferably be arranged on the information carrier at one level, i.e., in the same plane, along a line (9) in the storage medium (17).

In the event that a plurality of holograms arranged along a line are employed on an information carrier, it is conceivable, in addition to the holograms, to also insert markings into the information carrier and/or the storage medium. If utilized such markings can serve as a trigger for the camera and/or the read beam. In this way, it is easily possible to provide a signal to the camera when a new hologram is being imaged.

Furthermore, the use of the aforementioned device as a card reader for information carriers in the form of plastic cards of all types (bank cards, credit cards, identity cards, etc.) is also the subject of the present invention.

A further subject of the present invention is a method for data transmission which comprises (a) storing the data in the form of at least one Fourier hologram on a flat information carrier, for example a plastic card, and (b) moving the information carrier through a device comprising Fourier optics, a photodetector and a guide device, wherein the guide aligns the information carrier relative to the read beam and to the photodetector during the movement through the device, and reading the stored data in this way. The movement of the information carrier through the device during a reading operation is preferably carried out by drawing the card or carrier through manually.

A further subject of the present invention involves a system for data transmission comprising at least one flat information carrier, for example a plastic card, which contains data stored in the form of at least one Fourier hologram, and at least one reading device comprising Fourier optics, a photodetector and a guide device, which aligns the information carrier relative to the read beam and to the photodetector during the reading operation, in particular as the carrier or card is drawn manually through the device.

Such a system can be used for a large number of applications, for example, for the authentication of persons or goods or access control to buildings or rooms or for any desired application.

Additional advantages, features and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

All documents referred to herein are specifically incorporated herein by reference in their entireties.

As used herein and in the following claims, articles such as "the", "a" and "an" can connote the singular or plural.

DESIGNATIONS RELATING TO THE FIGURES

1 Information carrier (plastic card)
2 Fourier hologram
3 Light source with collimation optics
4 Beam splitter
5 Fourier lens
6 Detector (camera)
7 Collimated light beam (read beam)
8 Image on the camera
9 Line along which holograms can be stored
10 Guide rail 1
11 Guide rail 2
12 Roller
13 Pressure spring
14 Detector (forked light barrier)
15 Groove
16 Hole for read beam
17 Storage medium

The invention claimed is:

1. A system for reading data stored holographically, comprising:
(a) at least one flat information carrier, comprising a flat plastic card which contains data stored in the form of at least two Fourier holograms to be read separately, arranged in line in said information carrier, and further comprising markings applied to the information carrier that are configured to trigger a signal for a read beam or a detector,
wherein the data stored in the form of at least two Fourier holograms comprises an ISO/IEC 16022 data matrix code,
wherein the Fourier holograms each comprise a plurality of from 2-9 Fourier holograms combined to form a larger Fourier hologram, each hologram of said plurality that form the larger combined Fourier holograms having identical data content encoded therein; and (b) at least one reading device, comprising
  (i) a light source for producing a read beam,
  (ii) Fourier optics,
  (iii) a photodetector, and
  (iv) a guide that aligns the information carrier relative to the read beam and to the photodetector when the information carrier is drawn manually through the reading device, wherein a read spot produced by said read beam is smaller than the combined Fourier holograms and the read spot is 0.9 to 0.1 times as large as the combined Fourier holograms, wherein the guide restricts movement of the information carrier as it is drawn manually through the reading device in two spatial dimensions while the information carrier is moved manually in a third spatial direction in relation to the read beam and to the photodetector during reading of the combined Fourier holograms, and wherein as the information carrier is moved through the reading device, an image appears on the photodetector as soon as the read beam strikes at least one of the combined Fourier holograms on the information carrier partly, and intensity of the image rises until the read beam is irradiating at least one of the entire combined Fourier holograms, and then decreases to zero again until the read beam is no longer illuminating any of the entire combined Fourier holograms.

2. The system according to claim 1, wherein the Fourier holograms each comprise a plurality of four Fourier holograms combined to form a larger Fourier hologram.

3. The system according to claim 1, wherein the geometry of the larger combined Fourier holograms are matched to the profile of the read spot.

4. The system according to claim 1, wherein the larger combined Fourier holograms are 0.1 to 5 mm in diameter.

5. A method for reading data stored holographically, comprising:

(a) creating and storing data in the form of at least two Fourier holograms along a line on a flat information carrier, or on a plastic card, wherein the data stored in the form of at least two Fourier holograms comprises an ISO/IEC 16022 data matrix code, wherein the Fourier holograms each comprise a plurality of from 2-9 Fourier holograms combined to form a larger Fourier hologram, each hologram of said plurality that form the larger combined Fourier holograms having identical data content encoded therein; and (b) manually moving the information carrier or card through a reading device comprising
  (i) a light source for producing a read beam,
  (ii) Fourier optics,
  (iii) a photodetector, and
  (iv) a guide, said guide configured to align the information carrier relative to a read beam and to a photodetector during the movement of said carrier or card through the reading device, wherein a read spot produced by said read beam is smaller than the combined Fourier holograms and the read spot is 0.9 to 0.1 times as large as the combined Fourier holograms, wherein the guide restricts movement of the information carrier as it is drawn manually through the reading device in two spatial dimensions while the information carrier is moved manually in a third spatial direction in relation to the read beam and to the photodetector during reading of the combined Fourier holograms, and wherein as the information carrier is moved through the reading device, an image appears on the photodetector as soon as the read beam strikes at least one of the combined Fourier holograms on the information carrier partly, and intensity of the image rises until the read beam is irradiating at least one of the entire combined Fourier holograms and then decreases to zero again until the read beam is no longer illuminating any of the entire combined Fourier holograms; and (c) successively reading the combined Fourier holograms containing the data stored on said carrier or card holographically while the carrier or card is being displaced in relation to an incident laser beam.

6. A method to authenticate persons or goods or to provide access control to buildings or rooms, comprising: utilizing the system of claim 1 to read data stored on the information carrier, wherein said utilizing comprises presenting the flat information carrier to the reading device and manually drawing the information carrier through the reading device.

* * * * *